United States Patent
Hartman

(10) Patent No.: US 9,780,465 B1
(45) Date of Patent: Oct. 3, 2017

(54) ANGLED CIRCUIT BOARD CONNECTOR

(71) Applicant: Jeffrey David Hartman, Severn, MD (US)

(72) Inventor: Jeffrey David Hartman, Severn, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/270,816

(22) Filed: Sep. 20, 2016

(51) Int. Cl.
| | |
|---|---|
| *H01R 12/00* | (2006.01) |
| *H01R 12/52* | (2011.01) |
| *H01R 13/24* | (2006.01) |
| *H01R 43/02* | (2006.01) |
| *H01R 43/26* | (2006.01) |
| *H01R 107/00* | (2006.01) |

(52) U.S. Cl.
CPC ............. *H01R 12/52* (2013.01); *H01R 13/24* (2013.01); *H01R 43/0235* (2013.01); *H01R 43/26* (2013.01); *H01R 2107/00* (2013.01)

(58) Field of Classification Search
CPC ........ H01R 12/52; H01R 23/68; H01R 13/24; H01R 12/73; H01R 12/88; H01R 12/7088; H01R 2107/00; H01R 43/26; H01R 43/0235; H05K 1/141
USPC ........................................................... 439/65
See application file for complete search history.

(56) References Cited

U.S. PATENT DOCUMENTS

| | | | | |
|---|---|---|---|---|
| 5,338,207 A | * | 8/1994 | Lineberry | H01R 12/88 439/62 |
| 6,402,525 B2 | * | 6/2002 | Gugliotti | H01R 12/7088 439/62 |
| 6,719,574 B2 | * | 4/2004 | Grek | H05K 1/141 439/79 |
| 7,186,145 B1 | * | 3/2007 | Feldman | H01R 23/68 361/738 |
| D611,014 S | * | 3/2010 | Huang | D13/182 |
| 9,472,878 B2 | * | 10/2016 | Costello | H01R 12/73 |

\* cited by examiner

*Primary Examiner* — Jean F Duverne
(74) *Attorney, Agent, or Firm* — Tarolli, Sundheim, Covell & Tummino LLP

(57) ABSTRACT

An angled circuit board connector includes a unitary connector block having first and second board-contacting faces. The first and second board-contacting faces are arranged relative to each other at an operative angle. The connector block includes a block body. The first and second board-contacting faces face outward from the block body. A first connector port is located on the first board-contacting face. A second connector port is located on the second board-contacting face. A connector trace extends through at least a portion of the block body between the first and second board-contacting faces. The connector trace electrically connects the first and second connector ports.

18 Claims, 7 Drawing Sheets

ANGLED CIRCUIT BOARD CONNECTOR

GOVERNMENT SUPPORT

This invention was made with Government support under Contract No. 30059298. The Government has certain rights in this invention.

TECHNICAL FIELD

This disclosure relates to an apparatus and method for use of an angled circuit board connector and, more particularly, to an apparatus and method for electrically connecting pairs of pads on mutually angularly arranged circuit boards.

BACKGROUND

Sophisticated integrated systems may use a combination of circuit board configurations to achieve desired packaging size/shape goals. For example, two circuit boards, could be linked at an angle to one another (other than 180°) to fit in a desired use environment. These mutually-angled circuit boards need to be electrically connected together. Currently, commercial angle connectors are only capable of 90° connections between circuit boards, for several hundred I/O connections on a 0.5-0.75 mm pitch spacing.

SUMMARY

In an embodiment, an angled circuit board connector is described. A unitary connector block has first and second board-contacting faces. The first and second board-contacting faces are arranged relative to each other at an operative angle. The connector block includes a block body. The first and second board-contacting faces face outward from the block body. A first connector port is located on the first board-contacting face. A second connector port is located on the second board-contacting face. A connector trace extends through at least a portion of the block body between the first and second board-contacting faces. The connector trace electrically connects the first and second connector ports.

In an embodiment, a method is described. A planar distal substrate has longitudinally spaced top and bottom distal substrate surfaces and laterally spaced first and second distal substrate edges. At least one distal connector trace is created on the top distal substrate surface. The distal connector trace has first and second distal trace ends which are each laterally spaced inward from the respective first and second distal substrate edges. A conductive material is deposited along the at least one distal connector trace. First and second distal connector ports are created at the respective first and second distal trace ends. A planar proximal substrate having longitudinally spaced top and bottom proximal substrate surfaces and laterally spaced first and second proximal substrate edges is provided. At least one proximal connector trace is created on the top proximal substrate surface. The proximal connector trace has first and second proximal trace ends which are each laterally spaced inward from the respective first and second proximal substrate edges. The first and second proximal trace ends both are laterally spaced inward from the respective first and second distal trace ends. A conductive material is deposited along the at least one proximal connector trace. First and second proximal connector ports are created at the respective first and second proximal trace ends. The top distal substrate surface is directly attached to the bottom proximal substrate surface with the distal connector trace interposed therebetween to at least partially form a unitary connector block. The first proximal and distal substrate edges are removed at a first edge angle to laterally expose the proximal and distal first connector ports and create a first board-contacting face. The second proximal and distal substrate edges are removed at a second edge angle to laterally expose the proximal and distal second connector ports and create a second board-contacting face.

In an embodiment, an apparatus for electrically connecting pairs of pads on mutually angularly arranged circuit boards is described. A planar distal substrate has longitudinally spaced top and bottom distal substrate surfaces and laterally spaced first and second distal substrate edges. At least one distal connector trace is located on the top distal substrate surface. The distal connector trace has first and second distal trace ends. First and second distal connector ports are located at the respective first and second distal trace ends. A planar proximal substrate has longitudinally spaced top and bottom proximal substrate surfaces and laterally spaced first and second proximal substrate edges, and at least one proximal connector trace on the top proximal substrate surface. The proximal connector trace has first and second proximal trace ends. The first and second proximal trace ends both are laterally spaced inward from the respective first and second distal trace ends. First and second proximal connector ports are located at the respective first and second proximal trace ends. The top distal substrate surface and the bottom proximal substrate surface are directly attached together with the distal connector trace interposed therebetween to at least partially form a unitary connector block. The first proximal and distal substrate edges of the connector block are beveled at a first edge angle to laterally expose the proximal and distal first connector ports and create a first board-contacting face. The second proximal and distal substrate edges of the connector block are beveled at a second edge angle to laterally expose the proximal and distal second connector ports and create a second board-contacting face. The first and second edge angles collectively equating an operative angle.

BRIEF DESCRIPTION OF THE DRAWINGS

For a better understanding, reference may be made to the accompanying drawings, in which.

DESCRIPTION OF ASPECTS OF THE DISCLOSURE

Figure 1:
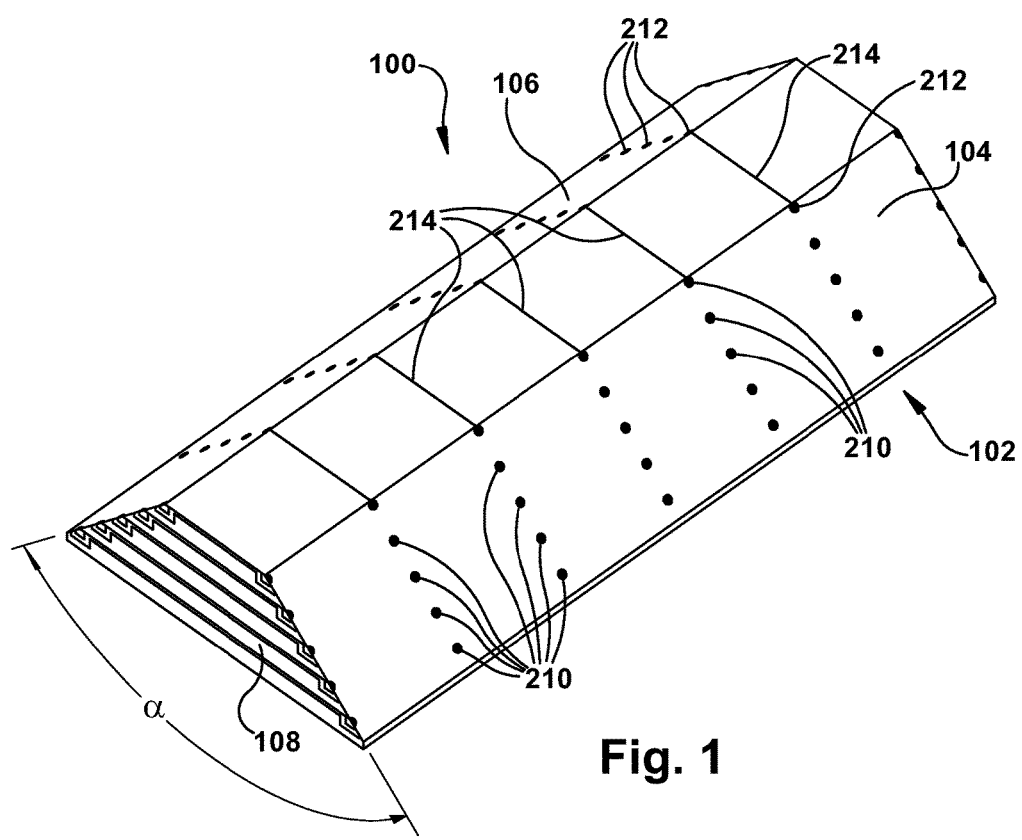
FIG. 1 is a schematic perspective front view of one aspect of the invention.

As used herein, the singular forms "a," "an" and "the" can include the plural forms as well, unless the context clearly indicates otherwise. It will be further understood that the terms "comprises" and/or "comprising," as used herein, can specify the presence of stated features, steps, operations, elements, and/or components, but do not preclude the presence or addition of one or more other features, steps, operations, elements, components, and/or groups thereof.

As used herein, the term "and/or" can include any and all combinations of one or more of the associated listed items.

As used herein, phrases such as "between X and Y" and "between about X and Y" can be interpreted to include X and Y.

As used herein, phrases such as "between about X and Y" can mean "between about X and about Y."

As used herein, phrases such as "from about X to Y" can mean "from about X to about Y."

It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It will also be appreciated by those of skill in the art that references to a structure or feature that is disposed "directly adjacent" another feature may have portions that overlap or underlie the adjacent feature, whereas a structure or feature that is disposed "adjacent" another feature might not have portions that overlap or underlie the adjacent feature.

Spatially relative terms, such as "under," "below," "lower," "over," "upper" and the like, may be used herein for ease of description to describe one element or feature's relationship to another element(s) or feature(s) as illustrated in the figures. It will be understood that the spatially relative terms can encompass different orientations of a device in use or operation, in addition to the orientation depicted in the figures. For example, if a device in the figures is inverted, elements described as "under" or "beneath" other elements or features would then be oriented "over" the other elements or features.

It will be understood that, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or steps) is not limited to the order presented in the claims or figures unless specifically indicated otherwise.

This technology comprises, consists of, or consists essentially of the following features, in any combination.

Figure 2:
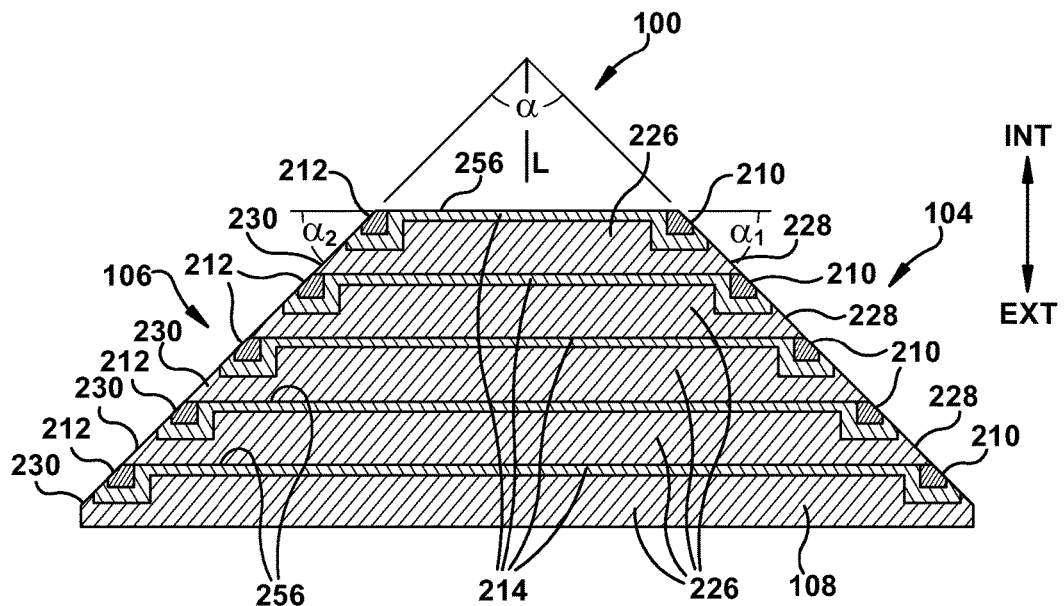
FIG. 2 is a schematic side view of the aspect of FIG. 1.

FIGS. 1-2 schematically depicts an angled circuit board connector 100. A unitary connector block 102 has first and second board-contacting faces 104 and 106, respectively. The term "unitary" is used herein to indicate that the connector block 102 is an undivided, whole, single-piece structure at the time of use. It should be understood that a "unitary" structure may be made up of multiple subassemblies, but that these subassemblies are agglomerated together into a single monolithic mass during the manufacturing process. Mere assembly of parts into a final product will not confer "unitary" status to a structure—a "unitary" structure here is one which has parts permanently bonded into a whole, with no substitution of parts contemplated during, or to facilitate, use.

The first and second board-contacting faces 104 and 106 are arranged relative to each other at an operative angle α. The operative angle α may be either less than 175° or more than 185°. For example, and as shown in FIGS. 1-2, the operative angle α is approximately 90°, or an orthogonal, "right" angle. The operative angle α may be, as shown and described herein, directly proportional to an angle between two circuit boards which are to be selectively placed into electrical contact, as described below. The relationship of the first and second board-contacting faces 104 and 106 to one another is shown in the Figures as being a substantially symmetrical one, about a centerline L of the block body 108, with each of the first and second board-contacting faces 104 and 108 being arranged at an angle of about one-half α to the centerline L. It is also contemplated, though, that the first and second board-contacting faces 104 and 106 could bear different angular relationships than shown to one another and to the centerline L.

The connector block 102 includes a block body 108. The first and second board-contacting faces 104 and 106 both face outward from the block body 108. As shown in FIG. 2, at least one first connector port 210 is located on the first board-contacting face 104. At least one second connector port 212 is located on the second board-contacting face 106. At least one connector trace 214 extends through at least a portion of the block body 108 (in an encapsulated, "tunneling" type manner) between the first and second board-contacting faces 104 and 106. Each connector trace 214 electrically connects a pair of first and second connector ports 210 and 212 for any desired purpose, including, but not limited to, the transmission of signals and/or providing a grounding path.

An array of first connector ports 210 are exposed on the first board-contacting face 104. An array of second connector ports 212 are exposed on the second board-contacting face 106. A plurality of connector traces 214 each electrically connect a selected first connector port 210 with a selected second connector port 212.

The operative angle α may be, as shown and described herein, directly proportional to an angle between first and second circuit boards 216 and 218, respectively, into which the first and second connector ports 210 and 212 are selectively placed into electrical contact. The first circuit board 216 includes at least one first pad 320, and the second circuit board 218 includes at least one second pad 322. The first and second pads 320 and 322 mutually form a pair 324 of pads. Each pair 324 of pads includes one first pad 320 and one second pad 322.

Figure 3:
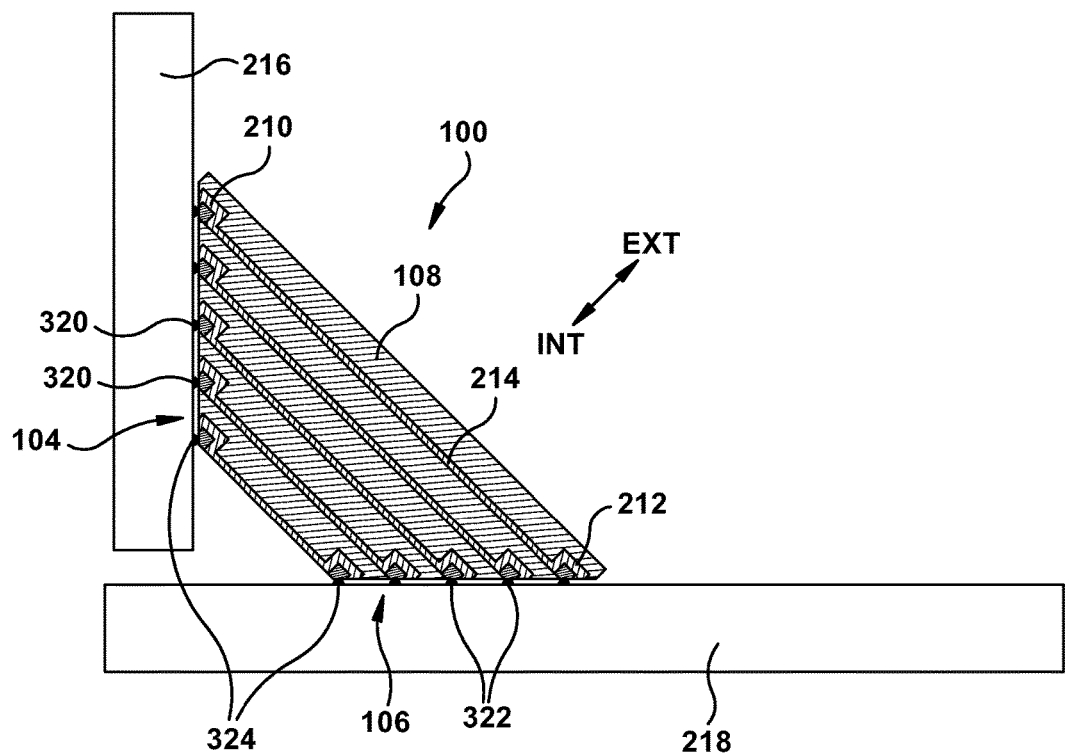
FIG. 3 is a schematic side view of the aspect of FIG. 1 in an example use environment.

Turning to FIGS. 2-3, the angled circuit board connector 100, which is an apparatus for electrically connecting pairs 324 of pads on mutually angularly arranged circuit boards 216 and 218, is depicted in more detail. The block body 108 includes at least one, and for many use environments a plurality of, laminated substrate layers 226. Each substrate layer 226 has oppositely disposed first and second layer edges 228 and 230, respectively. Each first layer edge 228 forms a portion of the first board-contacting face 104. Each second layer edge 230 forms a portion of the second board-contacting face 106.

The layered construction of the angled circuit board connector 100, and an example sequence of manufacture for the angled circuit board connector 100, will now be described with reference to FIGS. 4A-4I. In this description, the terms "distal" and "proximal" are used for ease of description of two substrate layers 226 relative to one another. However, the "distal" and "proximal" substrate layers 226 are merely used as relative, not absolute, descriptors. A planar distal substrate 226D has longitudinally spaced top and bottom distal substrate surfaces 432 and 434, respectively, and laterally spaced first and second distal substrate edges 436 and 438, respectively. The term "longitudinal" is used herein to refer to a direction substantially parallel to line Lo in FIG. 4A, or in the top to bottom direction, in the orientation of FIGS. 4A-4I. The "lateral" direction is one which is substantially perpendicular to the longitudinal direction, and the lateral direction is represented by line La in FIG. 4A.

At least one distal connector trace 214D is located on the top distal substrate surface 432, having been created there. The distal connector trace 214D has first and second distal trace ends 440 and 442. First and second distal connector ports 210D and 212D, respectively, are located at the respective first and second distal trace ends 440 and 442, after having been created there. The first and second distal trace ends 440 and 442 are each laterally spaced inward from the respective first and second distal substrate edges 436 and 438.

Figure 4A:
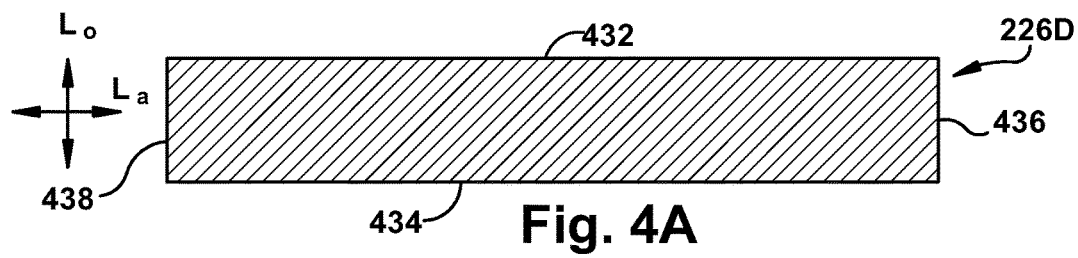
FIGS. 4A-4I schematically depict an example sequence of manufacture of the aspect of FIG. 1.
Figure 4B:
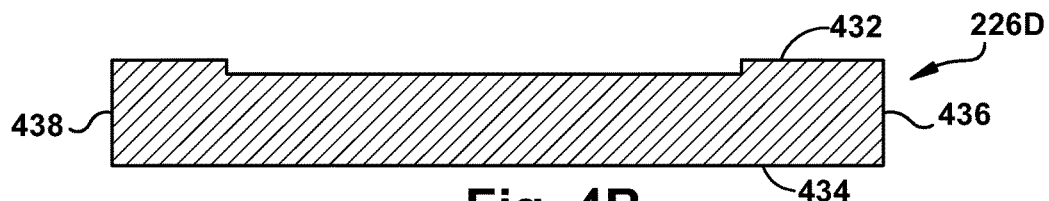
Figure 4C:
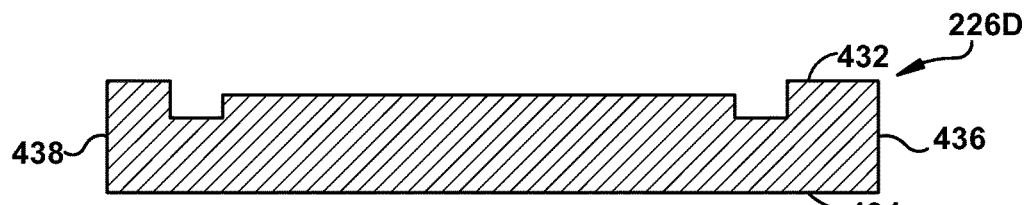
Figure 4D:
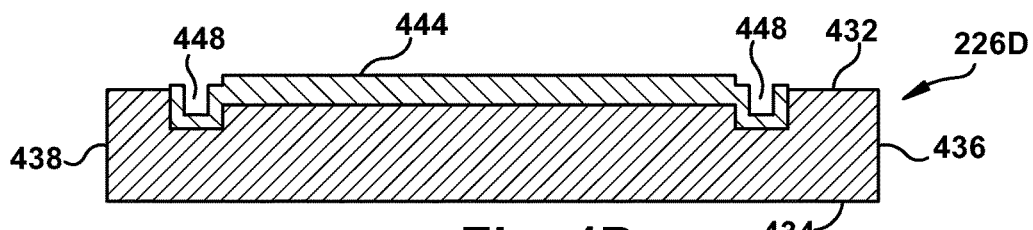
Figure 4E:
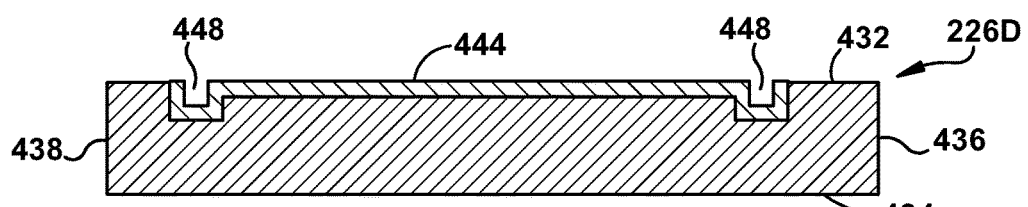
Figure 4F:
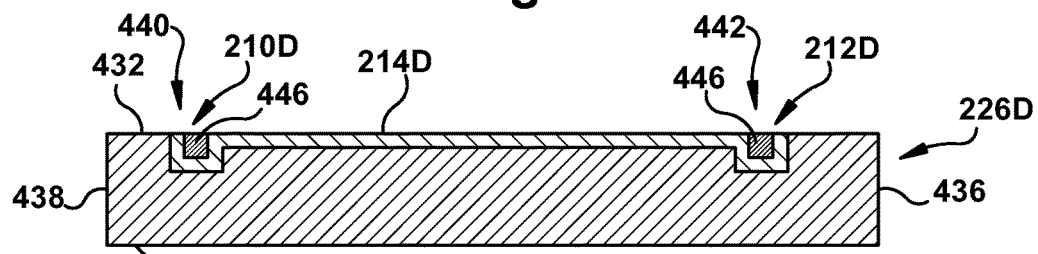

The distal connector trace 214D and the first and second distal connector ports 210D and 212D may be formed or created in any suitable manner. For example, and as shown in FIGS. 4B-4C, the distal connector trace 214D and the first and second distal connector ports 210D and 212D may be etched into the top distal substrate surface 432, sequentially or simultaneously. As shown in FIG. 4D, a conductive material 444 may be placed along the at least one distal connector trace 214D. As shown in the sequence of FIGS. 4D-4E, the conductive metal 444 may be shaved or trimmed down, in any desirable manner, to help level the top distal substrate surface 432.

The first and second distal connector ports 210D and 212D may be formed in any desired manner at the respective first and second distal trace ends 440 and 442. For example, and as shown in FIGS. 4C-4F, the first and second distal connector ports 210D and 212D may be created by a process which includes depositing solder 446 in reservoirs 448 at the first and second distal connector ports 210D and 212D. Alternately, though not shown, when a non-solder electrical connection (e.g., a press-contact or other type of electrical connection) is used to electrically connect the first and second connector ports 210 and 212 to respective first and second pads 320 and 322, any suitable substance or structure can be provided at the first and second distal trace ends 440 and 442, to facilitate the electrical connections which are made using the angled circuit board connector 100.

Figure 4G:
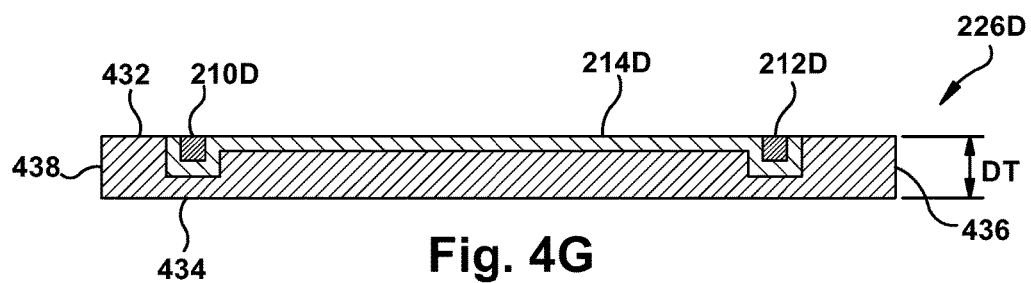

As shown in the sequences of FIGS. 4D-4E and FIGS. 4F-4G, at least one of the top and bottom distal substrate surfaces 432 and 434 may be planed, shaved, or otherwise machined after creation of a the distal connector trace 214D to reduce the distal substrate layer 226 to a predetermined distal substrate layer 226 thickness (DT, in FIG. 4G). This thickness reduction may be helpful in fitting more substrate layers 226, and thus more connector traces 214, into a predetermined connector block 102 height. In other words, there can be more, and closer-together, first connector ports 210 along the first board-contacting face 104, the second connector ports 212 along the second board-contacting face 106, if the substrate layers 226 have thicknesses that are smaller than the thicknesses of the substrate material which is originally provided, as in FIG. 4A, for creation of each substrate layer 226.

FIG. 4G depicts a completed distal substrate layer 226D. A proximal substrate layer 226P may be created, analogously. Because details of the construction of the proximal substrate layer 226P are substantially similar to the details provided above for creation of the distal substrate layer 226D, that description is considered to be incorporated herein by reference, mutatis mutandis, with the "distal" labels above being replaced with "proximal" labels for corresponding parts of the proximal substrate layer 226P, and the suffix "P" used for proximal substrate layer 226P element numbers which correspond to those previously described with respect to the distal substrate layer 226D.

Figure 4H:
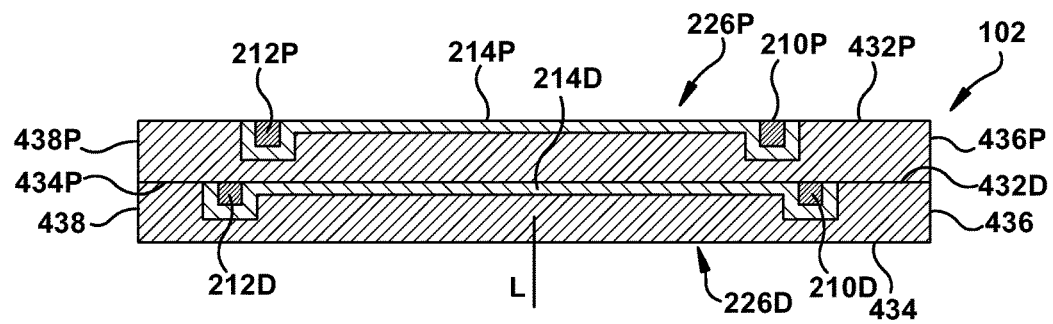

Accordingly, FIG. 4H depicts a proximal substrate layer 226P, formed analogously to the formation of the distal substrate layer 226D, and located atop the distal substrate layer 226D. It should be noted that the proximal connector trace 214P is shorter than the distal connector trace 214D, and that the proximal first and second connector ports 210P and 212P are each located laterally inward, toward a centerline L of the angled circuit board connector 100, than are the distal first and second connector ports 210D and 212D.

Figure 4I:
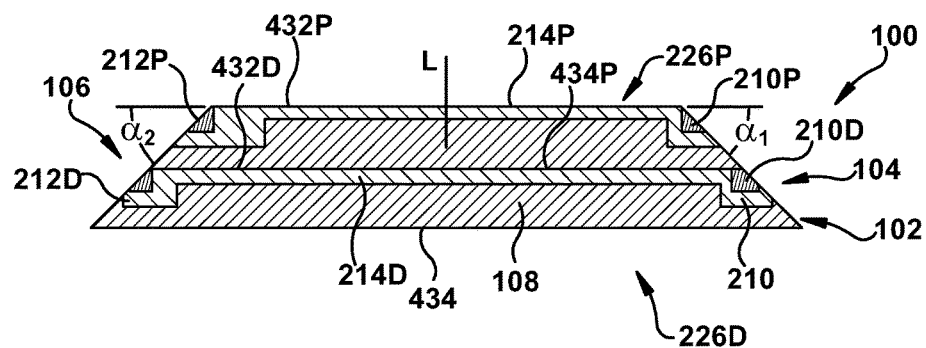

In FIG. 4H, the top distal substrate surface 432 has been directly attached to the bottom proximal substrate surface 434P with the distal connector trace 214D interposed therebetween to at least partially form a unitary connector block 102. This attachment may be accomplished in any desired manner, such as, but not limited to, oxide-to-oxide bonding, and adhesive bonding. Then, as shown in the sequence of FIGS. 4H-4I, the first proximal and distal substrate edges 436P and 436 of the connector block 102 are removed, or beveled, at a first edge angle $\alpha 1$ to laterally expose the proximal and distal first connector ports 210P and 210D and create a first board-contacting face 104. Similarly, the second proximal and distal substrate edges 438P and 438 of the connector block 102 are removed, or beveled, at a second edge angle $\alpha 2$ to laterally expose the proximal and distal second connector ports 212P and 212D and create a first board-contacting face 104. The first and second edge angles $\alpha 1$ and $\alpha 2$, whether they are the same or different, collectively equate an operative angle $\alpha$, which can be used as is described above and below, with reference to FIGS. 3 and 6, to join first and second circuit boards 216 and 218 at a desired angle, which is substantially similar to operative angle $\alpha$. As a result of this removal or beveling of the first proximal and distal substrate edges 436P and 436 and the second proximal and distal substrate edges 438P and 438 of the connector block 102, the top proximal substrate surface 432P, in the finished integrally formed and unitary angled circuit board connector 100, has a smaller area than the top distal substrate surface 432.

When the connector ports 210 and 212 include solder 446, the solder 446 is exposed on the first and second board-contacting faces 104 and 106 by the removal of the first and second proximal and distal substrate edges 436P, 436, 438P, and 438. It is contemplated that any suitable substance or structure could be provided to any of the first and second connector ports 210 and 212, at any point during manufacture of the angled circuit board connector 100 as desired to electrically connect the angled circuit board connector 100 to the pair 324 of pads.

FIGS. 5A-5I illustrate a second method of creating or manufacturing the angled circuit board connector 100, which may differ from that shown in FIGS. 4A-4I. Therefore, structures of FIGS. 5A-5I that are the same as or similar to those described with reference to FIGS. 4A-4I are either unnumbered or have the same reference numbers with the addition of a "prime" mark. Description of common elements and operation similar to those in the previously described first method of manufacture will not be repeated with respect to the second method of manufacture.

Figure 5A:
FIGS. 5A-5I schematically depict an example sequence of manufacture of the aspect of FIG. 1.
Figure 5B:
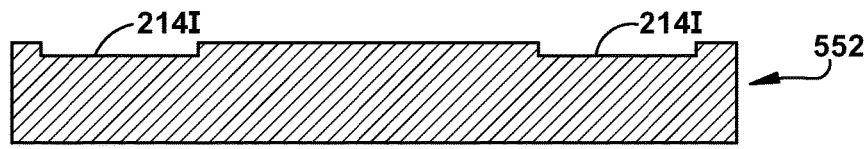
Figure 5C:
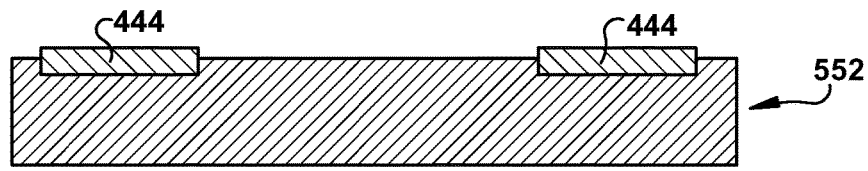
Figure 5D:
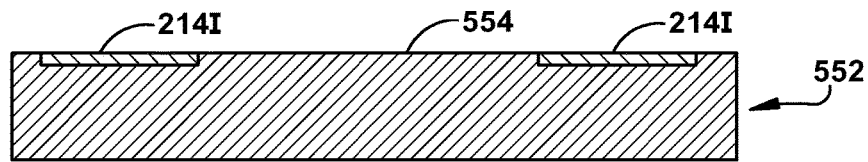
Figure 5E:
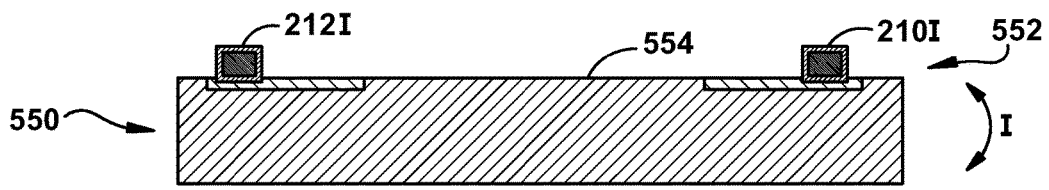

The second method of manufacture, depicted in FIGS. 5A-5I differs from that shown in FIGS. 4A-4I mainly in including the creation and provision of an intermediate substrate layer 550 which is shown as being provided as an intermediate layer blank 552 in FIG. 5A, machined with intermediate connector traces 214I in FIG. 5B, and those intermediate connector traces 214I being filled with conductive metal 444 in FIG. 5C. In FIG. 5D, the intermediate connector traces 2141 are shaved or planed flat to a top intermediate layer surface 554. First and second intermediate connector ports 2101 and 2121, which may be made using solder 446, or any other desired connecting structure or mechanism, are electrically connected to the intermediate connector traces 2141, as shown in FIG. 5E.

Figure 5F:
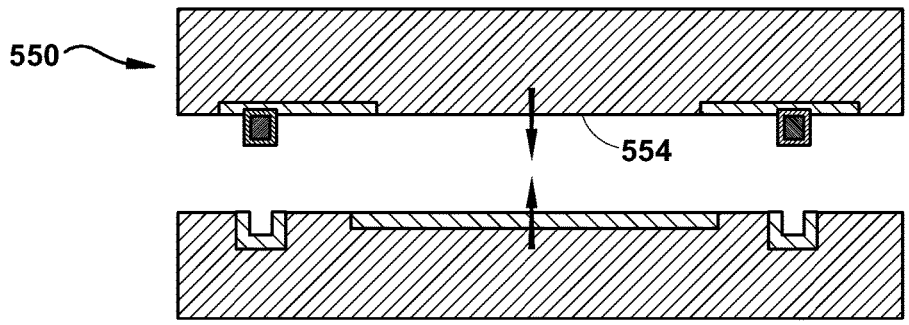
Figure 5G:
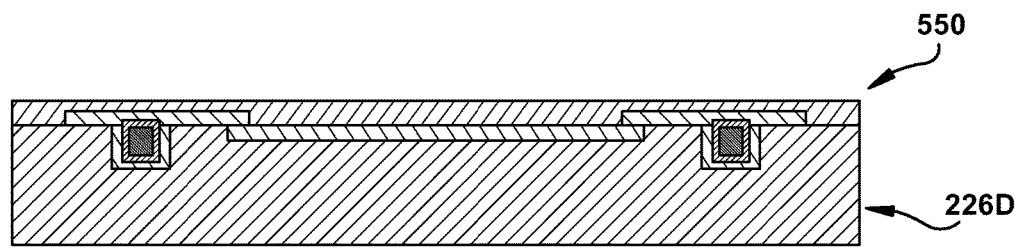
Figure 5H:
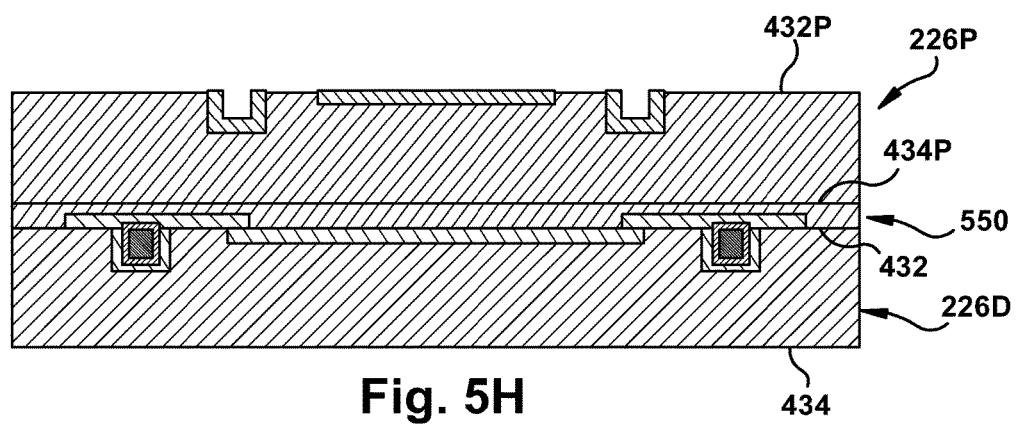
Figure 5I:
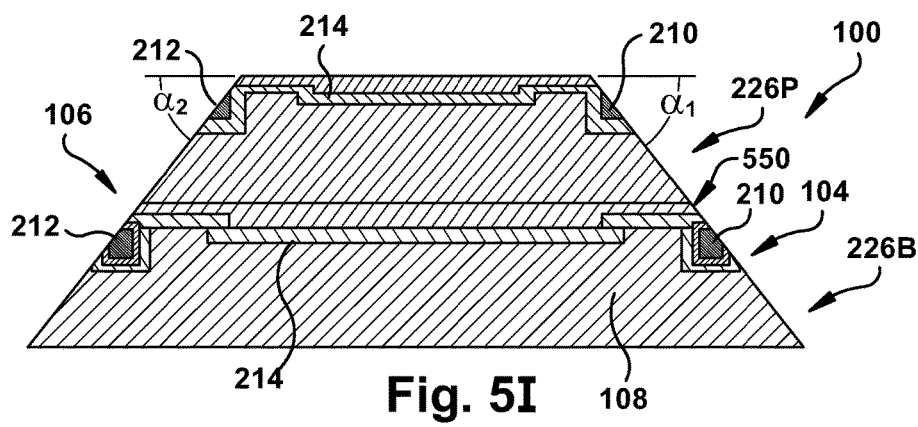

In the sequence of FIGS. 5E-5F, the intermediate substrate layer 550, formed in FIGS. 5A-5E, is inverted, as shown by rotation arrow "I" in FIG. 5E. The top intermediate layer surface 554 is now facing downward, and the orientation of FIGS. 5A-5I, and is bonded to the top distal substrate surface 432 of a distal substrate layer 226D which may have been created similarly to that shown in FIGS. 4A-4I. In FIG. 5G, the intermediate substrate layer 550 has been planed or shaved down to a thickness which is smaller than the thickness of the original intermediate layer blank 552. Turning to FIG. 5H, then, the bottom proximal substrate surface 434P is bonded to the intermediate substrate layer 550. The "stack" of an intermediate substrate layer 550 interposed longitudinally between the proximal and distal substrate layers 220 6P and 226D may then be machined, in any suitable manner, to create the final angled circuit board connector 100 including first and second edge angles α1 and α2, shown in FIG. 5I.

With reference back to FIG. 1, an array of second connector ports 212 (e.g., proximal and distal second connector ports 212P and 212D) may be exposed on the second board-contacting face 108, as shown. (Again, it should be noted that, when the angled circuit board connector 100 includes three or more laminated together substrate layers 226, the "proximal" and "distal" nature of those substrate layers 226 should be taken as relative, rather than absolute, nomenclature.) Though hidden from view on the back of the angled circuit board connector 100 as shown in FIG. 1, an array of first connector ports 210 (e.g., proximal and distal first connector ports 210P and 210D) likewise may be exposed on the first board-contacting face 104. A plurality of connector traces 214 (e.g., proximal and distal connector traces 214P and 214D) each electrically connect selected first connector ports 210, respectively, with selected second connector ports 212.

Turning now to FIG. 2 again, it can be seen that an interior substrate layer 226, defined herein as a substrate layer 226 that is located toward an interior ("INT") of the operative angle α, has a smaller laminated top surface area 256 than a laminated top surface area 256 of an exterior substrate layer 226, which is a substrate layer 226 that is located further outward (i.e., toward an exterior EXT) of the operative angle than is the interior substrate layer. Stated differently, each chosen laminated-together substrate layer 226 making up the connector block 102 has a smaller laminated top surface area 256 then that of all of the substrate layers 226 below, as shown in the orientation of FIG. 2, that chosen substrate layer 226. As an artifact of this tapered stack configuration, a first connector trace 214, located toward an interior ("INT") of the operative angle α, has a shorter trace length between connected first and second connector ports 210 and 212 than a trace length of a second connector trace 214, located further outward ("EXT") of the operative angle α than the first connector trace 214.

Also as shown in FIG. 2, the first layer edges 228 of the plurality of substrate layers 226 are all arranged at a first edge angle α1 with respect to the laminated top surfaces 256 of the respective substrate layers 226. The second layer edges 230 of the plurality of substrate layers 226 are arranged at a second edge angle α2 with respect to the laminated top surfaces 256 of the respective substrate layers 226. The first and second edge angles α1 and α2 together equal the operative angle α.

Figure 6:
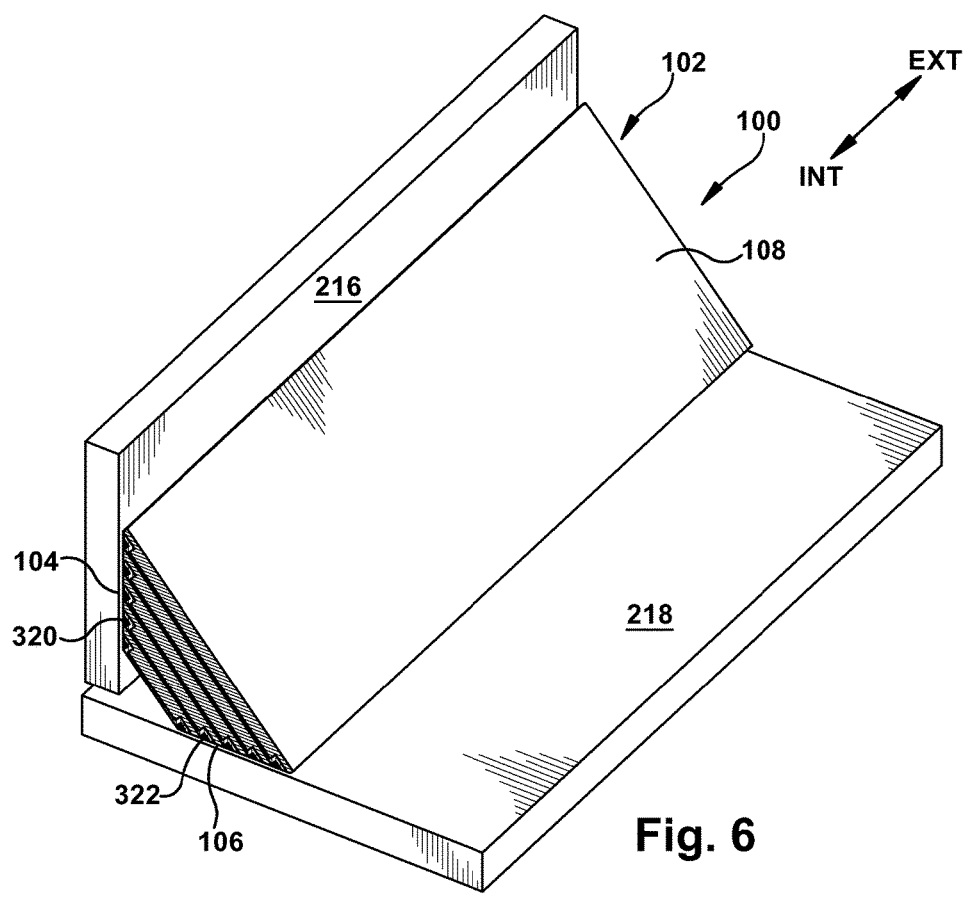
FIG. 6 is a schematic perspective front view of the aspect of FIG. 1 in the example use environment of FIG. 3.

With reference now to FIGS. 3 and 6, the pairs 324 of pads are placed into indirect mutual electrical connection via direct contact with respective first and second connector ports 210 and 212 and indirect contact with a corresponding connector trace 214.

A conductive material is located along the connector traces 214, to carry signals between a first pad 320, located on the first circuit board 216, and a second pad 322, located on the second circuit board 218. In this manner, the pads 320 of a first circuit board 216 can be placed into electrical communication with the pads 322 of a second circuit board 218 for transmission of signals in either direction therebetween, while the first and second circuit boards 216 and 218 are arranged and maintained at a board mutual angle to one another (as used herein, the phrase "board mutual angle" indicates that the first and second circuit boards 216 and 218 are not sitting edge-to-edge, at a 180° angle, or stacked one atop the other, at a 360° angle to one another). The board mutual angle of the circuit boards 216 and 218 is directly related to, likely similar to though need not be identical to, the operative angle α of the connector block 102. The first pad 320 is placed into electrical contact with the selected proximal or distal first connector port 210P or 210D. The second pad 322 is placed into electrical contact with the selected proximal or distal second connector port 212P or 212D. The first and second pads 320 and 322 are placed into indirect mutual electrical connection via a corresponding proximal or distal connector trace 214P or 214D.

In the schematic depictions of the Figures, the connector traces 214 are shown, for clarity, on outer surfaces of the angled circuit board connector 100. However, it is contemplated that the connector traces 214 could be instead encapsulated within the block body 108 by the placement of a substrate layer 226 over the outermost connector traces 214, or in any other desired manner (including, but not limited to, overmolding or other application of a protective layer, not shown, on one or more surface of the angled circuit board connector 100). In such a structure, one or more exposed surfaces (the topmost surface, in the orientation of FIG. 1, for example) of the angled circuit board connector 100 will not include any connector traces 214 for first and second connector ports 210 and 212. Similarly, though connector traces 214 are shown as being on the end faces of the angled circuit board connector 100 in the Figures for ease of description, these also could be located more deeply within the block body 108 than shown, such that the end faces are also devoid of connector traces 214 and/or first and second connector ports 210 and 212.

While aspects of this disclosure have been particularly shown and described with reference to the example embodiments above, it will be understood by those of ordinary skill in the art that various additional embodiments may be contemplated. For example, the specific methods described above for using the apparatus are merely illustrative; one of ordinary skill in the art could readily determine any number of tools, sequences of steps, or other means/options for placing the above-described apparatus, or components thereof, into positions substantively similar to those shown and described herein. Any of the described structures and components could be integrally formed as a single unitary or monolithic piece or made up of separate sub-components, with either of these formations involving any suitable stock or bespoke components and/or any suitable material or combinations of materials. Any of the described structures and components could be disposable or reusable as desired for a particular use environment. Any component could be provided with a user-perceptible marking to indicate a material, configuration, at least one dimension, or the like pertaining to that component, the user-perceptible marking aiding a user in selecting one component from an array of similar components for a particular use environment. A "predetermined" status may be determined at any time before the structures being manipulated actually reach that status, the "predetermination" being made as late as immediately before the structure achieves the predetermined status. Though certain components described herein are shown as having specific geometric shapes, all structures of this disclosure may have any suitable shapes, sizes, configurations, relative relationships, cross-sectional areas, or any other physical characteristics as desirable for a particular application. Any structures or features described with reference to one embodiment or configuration could be provided, singly or in combination with other structures or features, to any other embodiment or configuration, as it would be impractical to describe each of the embodiments and configurations discussed herein as having all of the options discussed with respect to all of the other embodiments and configurations. A device or method incorporating any of these features should be understood to fall under the scope of this disclosure as determined based upon the claims below and any equivalents thereof.

Other aspects, objects, and advantages can be obtained from a study of the drawings, the disclosure, and the appended claims.

I claim:

1. An angled circuit board connector, comprising:
a unitary connector block having first and second board-contacting faces, the first and second board-contacting faces being arranged relative to each other at an operative angle, the connector block including a block body, the first and second board-contacting faces facing outward from the block body;
a first connector port located on the first board-contacting face;
a second connector port located on the second board-contacting face; and
a connector trace extending through at least a portion of the block body between the first and second board-contacting faces, the connector trace electrically connecting the first and second connector ports;
wherein a first connector trace, located toward an interior of the operative angle, has a shorter trace length between connected first and second connector ports than a trace length of a second connector trace, located further outward of the operative angle than the first connector trace.

2. The angled circuit board connector of claim 1, wherein the operative angle is either less than 175° or more than 185°.

3. The angled circuit board connector of claim 1, wherein the operative angle is directly proportional to an angle between two circuit boards into which the first and second connector ports, respectively, are selectively placed into electrical contact.

4. The angled circuit board connector of claim 1, wherein an array of first connector ports are exposed on the first board-contacting face, an array of second connector ports are exposed on the second board-contacting face, and a plurality of connector traces each electrically connect a selected first connector port with a selected second connector port.

5. The angled circuit board connector of claim 1, wherein the block body includes a plurality of laminated substrate layers, each substrate layer having oppositely disposed first and second layer edges, each first layer edge forming a portion of the first board-contacting face and each second layer edge forming a portion of the second board-contacting face.

6. The angled circuit board connector of claim 5, wherein an interior substrate layer, located toward an interior of the operative angle, has a smaller laminated top surface area than a laminated top surface area of an exterior substrate layer, located further outward of the operative angle than the interior substrate layer.

7. The angled circuit board connector of claim 5, wherein the first layer edges of the plurality of substrate layers are arranged at a first edge angle with respect to the laminated top surfaces of the respective substrate layers, the second layer edges of the plurality of substrate layers are arranged at a second edge angle with respect to the laminated top surfaces of the respective substrate layers, and the first and second edge angles together equal the operative angle.

8. A method comprising:
providing a planar distal substrate having longitudinally spaced top and bottom distal substrate surfaces and laterally spaced first and second distal substrate edges;
creating at least one distal connector trace on the top distal substrate surface, the distal connector trace having first and second distal trace ends which are each laterally spaced inward from the respective first and second distal substrate edges;
depositing a conductive material along the at least one distal connector trace;
creating first and second distal connector ports at the respective first and second distal trace ends;
providing a planar proximal substrate having longitudinally spaced top and bottom proximal substrate surfaces and laterally spaced first and second proximal substrate edges;
creating at least one proximal connector trace on the top proximal substrate surface, the proximal connector trace having first and second proximal trace ends which are each laterally spaced inward from the respective first and second proximal substrate edges, the first and second proximal trace ends both being laterally spaced inward from the respective first and second distal trace ends;
depositing a conductive material along the at least one proximal connector trace;
creating first and second proximal connector ports at the respective first and second proximal trace ends;
directly attaching the top distal substrate surface to the bottom proximal substrate surface with the distal connector trace interposed therebetween to at least partially form a unitary connector block;
removing the first proximal and distal substrate edges at a first edge angle to laterally expose the proximal and distal first connector ports and create a first board-contacting face; and
removing the second proximal and distal substrate edges at a second edge angle to laterally expose the proximal and distal second connector ports and create a second board-contacting face.

9. The method of claim 8, wherein creating first and proximal and distal second connector ports at the respective first and second proximal and distal trace ends includes depositing solder in reservoirs at the first and proximal and distal second connector ports, the solder being exposed on the first and second board-contacting faces.

10. The method of claim 8, including planing at least one of the top and bottom proximal and distal substrate surfaces after creation of a respective proximal and/or distal connector trace to bring the proximal and/or distal substrate layer to a predetermined proximal and/or distal substrate layer thickness.

11. The method of claim 8, wherein at least one of creating at least one proximal connector trace on the top proximal substrate surface and creating at least one distal connector trace on the top distal substrate surface includes creating an array of proximal and/or distal connector traces on the top proximal and/or distal substrate surfaces.

12. The method of claim 8, wherein an array of proximal and distal first connector ports are exposed on the first board-contacting face, an array of proximal and distal second connector ports are exposed on the second board-contacting face, and a plurality of proximal and distal connector traces each electrically connect selected proximal and distal first connector ports, respectively, with selected proximal and distal second connector ports, the method including:
  creating an operative angle of the connector block equal to the first and second edge angles;
  providing a first circuit board including at least one first pad corresponding to a position of a selected proximal or distal first connector port;
  providing a second circuit board including at least one second pad corresponding to a position of a selected proximal or distal second connector port;
  maintaining the first and second circuit boards at a board mutual angle relative to each other, the board mutual angle of the circuit boards being directly related to the operative angle of the connector block;
  placing the first pad into electrical contact with the selected proximal or distal first connector port;
  placing the second pad into electrical contact with the selected proximal or distal second connector port; and
  placing the first and second pads into indirect mutual electrical connection via a corresponding proximal or distal connector trace.

13. An apparatus for electrically connecting pairs of pads on mutually angularly arranged circuit boards, the apparatus comprising:
  a planar distal substrate having longitudinally spaced top and bottom distal substrate surfaces and laterally spaced first and second distal substrate edges;
  at least one distal connector trace located on the top distal substrate surface, the distal connector trace having first and second distal trace ends;
  first and second distal connector ports located at the respective first and second distal trace ends;
  a planar proximal substrate having longitudinally spaced top and bottom proximal substrate surfaces and laterally spaced first and second proximal substrate edges;
  at least one proximal connector trace on the top proximal substrate surface, the proximal connector trace having first and second proximal trace ends, the first and second proximal trace ends both being laterally spaced inward from the respective first and second distal trace ends; and
  first and second proximal connector ports located at the respective first and second proximal trace ends;
  wherein the top distal substrate surface and the bottom proximal substrate surface are directly attached together with the distal connector trace interposed therebetween to at least partially form a unitary connector block;
  wherein the first proximal and distal substrate edges of the connector block are beveled at a first edge angle to laterally expose the proximal and distal first connector ports and create a first board-contacting face; and
  wherein the second proximal and distal substrate edges of the connector block at a second edge angle to laterally expose the proximal and distal second connector ports and create a second board-contacting face, the first and second edge angles collectively equating an operative angle.

14. The apparatus of claim 13, wherein a conductive material is located along the at least one distal connector trace and the at least one proximal connector trace.

15. The apparatus of claim 13, wherein the operative angle is either less than 175° or more than 185°.

16. The apparatus of claim 13, wherein the operative angle is directly proportional to a board mutual angle between the two mutually angularly arranged circuit boards.

17. The apparatus of claim 13, wherein an array of proximal and distal first connector ports are exposed on the first board-contacting face, an array of proximal and distal second connector ports are exposed on the second board-contacting face, and a plurality of proximal and distal connector traces each electrically connect selected proximal and distal first connector ports, respectively, with selected proximal and distal second connector ports, and wherein the pairs of pads are placed into indirect mutual electrical connection via direct contact with respective first and proximal and distal second connector ports and indirect contact with a corresponding proximal or distal connector trace.

18. The apparatus of claim 13, wherein the top proximal substrate surface has a smaller area than the top distal substrate surface.

* * * * *